(12) United States Patent
Potnis et al.

(10) Patent No.: US 11,662,579 B2
(45) Date of Patent: May 30, 2023

(54) COMBINER LENS FAULT DETECTION SYSTEM

(71) Applicant: GOOGLE LLC, Mountain View, CA (US)

(72) Inventors: Shreyas Potnis, Kitchener (CA); Kevin Orr, Kitchener (CA); Kai Xu, Mississauga (CA)

(73) Assignee: GOOGLE LLC, Mountain View, CA (US)

( * ) Notice: Subject to any disclaimer, the term of this patent is extended or adjusted under 35 U.S.C. 154(b) by 285 days.

(21) Appl. No.: 16/898,773

(22) Filed: Jun. 11, 2020

(65) Prior Publication Data

US 2021/0157140 A1    May 27, 2021

Related U.S. Application Data

(60) Provisional application No. 62/860,309, filed on Jun. 12, 2019.

(51) Int. Cl.
| | | |
|---|---|---|
| *G02B 27/01* | (2006.01) | |
| *G01R 15/04* | (2006.01) | |
| *G01R 19/10* | (2006.01) | |
| *G01R 27/26* | (2006.01) | |
| *G01R 31/52* | (2020.01) | |
| *F21V 8/00* | (2006.01) | |

(52) U.S. Cl.
CPC ......... *G02B 27/0149* (2013.01); *G01R 15/04* (2013.01); *G01R 19/10* (2013.01); *G01R 27/26* (2013.01); *G01R 31/52* (2020.01); *G02B 6/0083* (2013.01); *G02B 2027/0167* (2013.01)

(58) Field of Classification Search
CPC ........ G01R 15/00; G01R 15/04; G01R 19/00; G01R 19/10; G01R 27/00; G01R 27/02; G01R 27/26; G01R 31/00; G01R 31/50; G01R 31/52; G01R 31/54; G02B 6/00; G02B 6/0001; G02B 6/0011; G02B 6/0081; G02B 6/0083; G02B 26/00; G02B 26/08; G02B 26/10; G02B 26/101; G02B 27/00; G02B 27/01; G02B 27/0101; G02B 27/0138; G02B 27/0149; G02B 27/017; G02B 27/0179; G02B 2027/0167; G02B 2027/0187
See application file for complete search history.

(56) References Cited

U.S. PATENT DOCUMENTS

| | | | | |
|---|---|---|---|---|
| 3,792,239 A | * | 2/1974 | Ohlhaber | G02B 6/43 235/494 |
| 7,701,231 B2 | * | 4/2010 | Yonushonis | B01D 46/0086 324/718 |
| 10,663,732 B2 | * | 5/2020 | Holland | G02B 27/141 |
| 2018/0348526 A1 | * | 12/2018 | Potnis | G02B 27/0955 |
| 2018/0348529 A1 | * | 12/2018 | Blum | G02B 27/0176 |

* cited by examiner

*Primary Examiner* — Hoai-An D. Nguyen

(57) ABSTRACT

A combiner lens system includes a lens and a lightguide in stack with the lens. The lightguide carries one or more electrically conductive traces. A detector circuit is electrically coupled to the one or more electrically conductive traces to form an electrical circuit. The detector circuit monitors the electrical circuit for an open circuit or a short circuit and generates an output signal that is indicative of a state of the electrical circuit.

16 Claims, 10 Drawing Sheets

COMBINER LENS FAULT DETECTION SYSTEM

CROSS-REFERENCE TO RELATED APPLICATIONS

This application claims the benefit of U.S. Provisional Application No. 62/860,309, filed 12 Jun. 2019, titled "Combiner Lens Fault Detection System", the content of which is incorporated herein by reference.

BACKGROUND

Optical combiners are used in wearable heads-up displays (WHUDs) to combine real world and virtual images. Optical combiners may be integrated with lenses to provide combiner lenses having the form factor of eyeglasses. Optical combiners may be free-space combiners or substrate-guided combiners. Free-space combiners use one or more reflective, refractive, or diffractive optical elements to direct light from a light source to an eye. Substrate-guided combiners use a guide substrate, e.g., a lightguide (or waveguide), and coupler(s) to transfer light to an eye of a WHUD user. In a lightguide combiner, light enters the lightguide, typically through an in-coupler, propagates along the length of the lightguide by total internal reflection (TIR), and exits the lightguide through an out-coupler. The in-coupler and out-couplers are typically gratings. There may be additional optical elements to redirect light within the lightguide.

In laser-based WHUDs, the light coupled into the lightguide is laser light. If the lightguide cracks or breaks during use, laser light may leak out of the lightguide at the faults in the lightguide. If the faults occur at a location before the out-coupler, the laser light coupled into the lightguide may not reach the out-coupler, or a smaller fraction of the laser light coupled into the lightguide may reach the out-coupler, which would affect the display quality. In some cases, a much higher laser power than would ultimately be delivered to the eye may be coupled into the lightguide. The much higher laser power may be selected because of expected inefficiencies in the system such that when the laser light is coupled out of the lightguide through the out-coupler, the appropriate level of laser power will be delivered to the eye to achieve a display with the appropriate brightness. In cases where the lightguide may contain a relatively high level of laser power, laser emission from faults in the lightguide may pose safety concerns. Safety concerns may be not only to the WHUD user but also to an observer that happens to be standing in front of the WHUD user and in the field of view of the lightguide combiner.

SUMMARY

In a first aspect, a combiner lens may be summarized as including a first lens, a lightguide in stack with the first lens, and one or more first electrically conductive traces formed on or carried by the lightguide. Each first electrically conductive trace has first input and output terminals for electrical connections.

Variants of the combiner lens according to the first aspect may further include one or more of the features described in A1 to A5 below.

A1: The lightguide has a first lightguide surface and a second lightguide surface, which are spaced apart by a substrate thickness of the lightguide. Each first electrically conductive trace may be formed at least in part on the first lightguide surface. One or more second electrically conductive traces may be formed at least in part on the second lightguide surface. Each second electrically conductive trace has second input and output terminals for electrical connections.

A2: One or more second electrically conductive traces may be formed on or carried by the first lens. Each second electrically conductive trace has second input and output terminals for electrical connections. Each first electrically conductive trace may be formed on a surface of the lightguide, and the at least a second electrically conductive trace may be formed on an inner lens surface that is in opposing relation to the lightguide surface.

A3: A gap may be provided between an inner lens surface of the first lens and a surface of the lightguide that is in opposing relation to the inner lens surface. A plurality of first electrically conductive traces may be formed on the lightguide surface. A plurality of second electrically conductive traces may be formed on the inner lens surface. The first electrically conductive traces may be oriented in a first direction, and the second electrically conductive traces may be oriented in a second direction that is different from the first direction.

A4: A second lens may be in stack with the lightguide and the first lens, with the lightguide positioned between the first lens and the second lens. One or more second electrically conductive traces may be formed on or carried by at least one of the first lens and the second lens. An inner surface of the first lens may be separated from the lightguide by a first gap, and an inner surface of the second lens may be separated from the lightguide by a second gap.

A5: An in-coupler and an out-coupler may be carried by the lightguide. The in-coupler may couple light into the lightguide, and the out-coupler may couple light out of the lightguide.

In a second aspect, a combiner lens system may be summarized as including a first lens; a lightguide in stack with the first lens, the lightguide having a first lightguide surface and a second lightguide surface that is spaced apart from the first lightguide surface by a substrate thickness of the lightguide; one or more first electrically conductive traces formed at least in part on the first lightguide surface, each of the first electrically conductive trace having a first input terminal and a first output terminal for electrical connections; and an open circuit detector electrically coupled to the terminals to form an electrical circuit that is normally closed, the open circuit detector to monitor the electrical circuit for an open circuit and generate an output signal that is indicative of an electrical state of the electrical circuit.

Variants of the combiner lens system may further include one or more of the features described in B1 to B3 below.

B1: The open circuit detector may include a voltage divider circuit electrically coupled to the terminals of the first electrically conductive trace(s). The open circuit detector may further include a comparator that receives an output of the voltage divider circuit as a first input and a reference voltage as a second input. The comparator generates a comparator signal that is representative of a comparison between the output of the voltage divider circuit and the reference voltage, where the comparator signal has a first value when the electrical circuit is a closed circuit and a second value when the electrical circuit is an open circuit.

B2: One or more second electrically conductive traces may be formed on at least one of the second lightguide surface and a surface of the lens. Each second electrically conductive trace has second input and output terminals for electrical connections. The open circuit detector may include a summing circuit having an input electrically coupled to the output terminals of the first and second conductive traces. The summing circuit generates a summing signal that is proportional to a sum of voltages at the output terminals of the conductive traces. The open circuit detector may include a comparator that receives the summing signal as a first input and a reference voltage as a second input. The comparator generates a comparator signal that is representative of a comparison between the summing signal and the reference voltage, where the comparator signal has a first value when the electrical circuit is a closed circuit and a second value when the electrical circuit is an open circuit.

B3: A second lens may be in stack with the first lens and the lightguide, with the lightguide between the first lens and the second lens. One or more second electrically conductive traces may be formed on at least one of the second lightguide surface, a surface of the first lens, and a surface of the second lens. Each second electrically conductive trace has second input and output terminals for electrical connections. The open circuit detector may be electrically coupled to the terminals of each of the first and second conductive traces to form a respective electrical circuit that is normally closed. The open circuit detector monitors each respective circuit for an open circuit and generates an output signal that is indicative of an electrical state of the electrical circuits.

In a third aspect, a combiner lens system may be summarized as including a lens having an inner lens surface; a lightguide in stack with the lens, the lightguide having a first lightguide surface in opposing relation to the inner lens surface, the lightguide having a second lightguide surface that is spaced apart from the first lightguide surface by a substrate thickness of the lightguide; a matrix of conductive traces including a plurality of first electrically conductive traces formed on the first lightguide surface and a plurality of second electrically conductive traces formed on the inner lens surface, the plurality of first electrically conductive traces oriented in a first direction, and the plurality of second electrically conductive traces oriented in a second direction that is different from the first direction; and a short circuit detector electrically coupled to the first and second conductive traces, the short circuit detector to monitor the matrix of conductive traces for a short circuit and to generate an output signal that is indicative of an electrical state of the matrix of conductive traces. In some cases, the short circuit detector includes a microcontroller having first ports connected to the first electrically conductive traces and second ports connected to the second electrically conductive traces, the microcontroller programmed to apply a voltage sequentially to the first electrically conductive traces and scan output voltages at the second ports.

In a fourth aspect, a combiner lens system may be summarized as including a lens having an inner lens surface; a lightguide in stack with the lens, the lightguide having a first lightguide surface in opposing relation to the inner lens surface and spaced from the inner lens surface by a gap, the lightguide having a second lightguide surface that is spaced apart from the first lightguide surface by a substrate thickness of the lightguide; a first electrically conductive trace formed on or carried by the first lightguide surface; a second electrically conductive trace formed on or carried by the inner lens surface; and a capacitive sensing circuit electrically coupled to the first and second conductive traces to monitor the gap for a dielectric change and generate an output signal that is indicative of a dielectric state of the gap.

In a fifth aspect, a laser projector system may be summarized as including a laser projector having at least one laser source to generate laser light; a lightguide to receive the laser light from the laser projector, the lightguide carrying at least one electrically conductive trace; a first circuit electrically coupled to the at least one electrically conductive trace to form an electrical circuit, the first circuit to monitor the electrical circuit for an open circuit or a short circuit and generate an output signal that is indicative of an electrical state of the electrical circuit; and a second circuit in communication with the scanning laser projector and the first circuit, the second circuit to disable the at least one laser source when the output signal of the first circuit indicates an open circuit or a short circuit.

The foregoing general description and the following detailed description are exemplary of the invention and are intended to provide an overview or framework for understanding the nature of the invention as it is claimed. The accompanying drawings are included to provide further understanding of the invention and are incorporated in and constitute part of this specification. The drawings illustrate various embodiments of the invention and together with the description serve to explain the principles and operation of the invention.

BRIEF DESCRIPTION OF DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements and have been solely selected for ease of recognition in the drawing.

DETAILED DESCRIPTION

Figure 1:
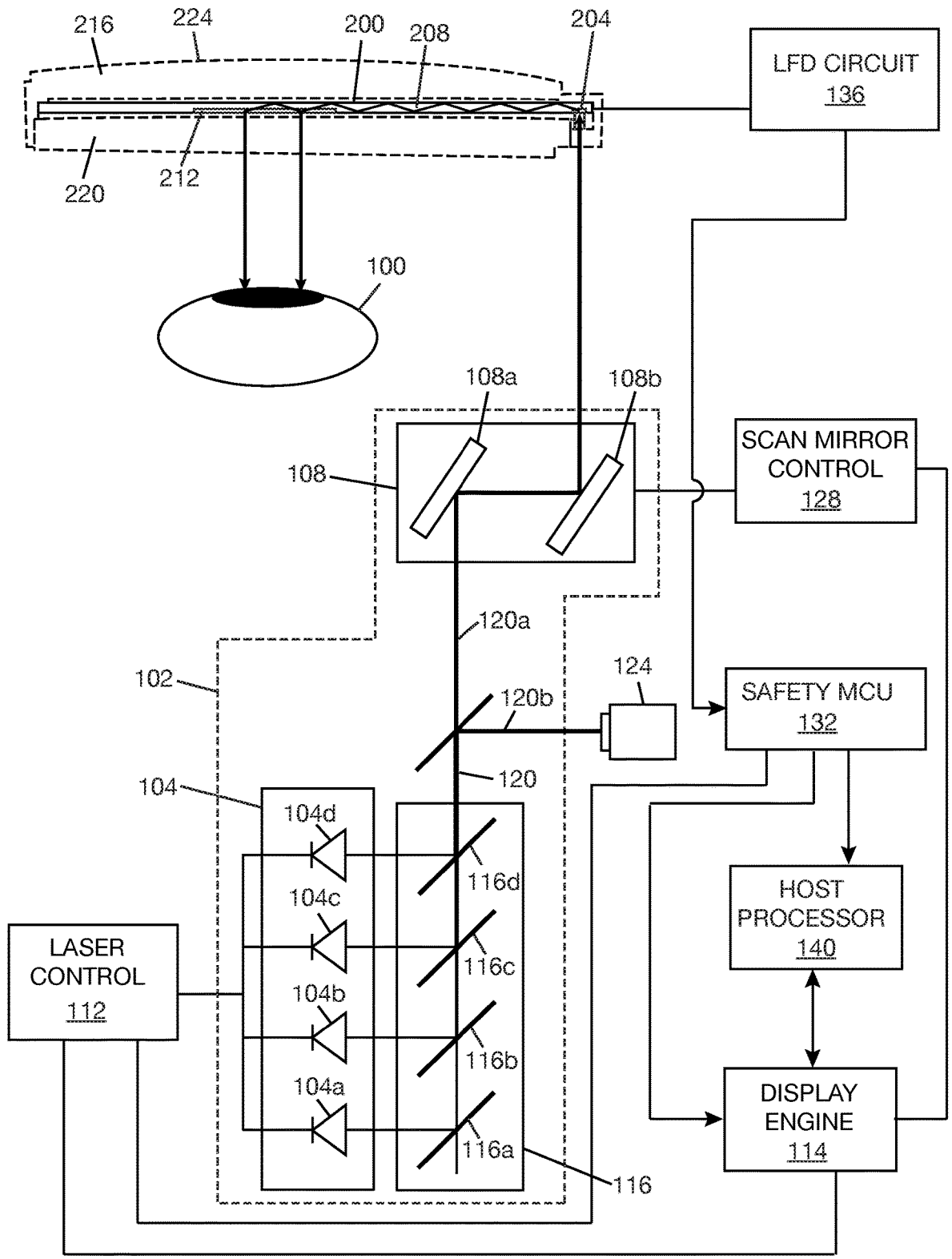
FIG. 1 is a block diagram of a portion of a wearable heads-up display (WHUD) positioned relative to an eye according to one implementation.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices have not been shown or described in detail to avoid unnecessarily obscuring descriptions of the embodiments. For the sake of continuity, and in the interest of conciseness, same or similar reference characters may be used for same or similar objects in multiple figures. For the sake of brevity, the term "corresponding to" may be used to describe correspondence between features of different figures. When a feature in a first figure is described as corresponding to a feature in a second figure, the feature in the first figure is deemed to have the characteristics of the feature in the second figure, and vice versa, unless stated otherwise.

In the disclosure, unless the context requires otherwise, throughout the specification and claims which follow, the word "comprise" and variations thereof, such as, "comprises" and "comprising" are to be construed in an open, inclusive sense, that is as "including, but not limited to."

In the disclosure, reference to "one implementation" or "an implementation" or to "one embodiment" or "an embodiment" means that a particular feature, structures, or characteristics may be combined in any suitable manner in one or more implementations or one or more embodiments.

In the disclosure, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the disclosure provided herein are for convenience only and do not interpret the scope or meaning of the embodiments.

FIG. 1 is an illustrative diagram showing a portion of a wearable heads-up display (WHUD) positioned relative to an eye 100. The portion of the WHUD shown includes a scanning laser projector (SLP) 102, which includes a laser module 104 to generate light and an optical scanner 108 to scan the light over a target. The portion of the WHUD shown also includes an optical combiner 200, which is positioned in a field of view of eye 100. In one example, optical combiner 200 includes an in-coupler 204, a lightguide 208, and an out-coupler 212. In-coupler 204 is positioned and designed to receive light projected by SLP 102 and couple the received light into lightguide 208. The light coupled into lightguide 208 propagates along lightguide 208 by total internal reflection (TIR). Out-coupler 212 is positioned and designed to couple light out of lightguide 208. At least a portion of the light coupled out of lightguide 208 through out-coupler 212 will be received by eye 100. Optical combiner 200 may be stacked with lenses (or lens parts) 216, 220 to form a combiner lens 224 that can be fitted into a support frame (not shown) of the WHUD.

Laser module 104 includes one or more laser diodes, e.g., visible laser diodes 104a, 104b, 104c to generate visible light and infrared laser diode 104d to generate infrared light. In general, laser module 104 may include any combination, type, and number of laser diodes, depending on the desired characteristics of SLP 102. In some examples, visible laser diode 104a may be a red laser diode to generate red light, visible laser diode 104b may be a blue laser diode to generate blue light, and visible laser diodes 104c may be a green laser diode to generate green light. The visible light generated by laser module 104 may be used to form a virtual display in a field of view of eye 100. The infrared light generated by laser module 104 may be used to track the gaze direction of eye 100 or to obtain a scan of eye 100 from which features on the eye may be detected, for example. A laser control 112 includes laser diode drivers (LDDs) (not shown separately) to operate the laser diodes 104a, 104b, 104c, 104d. The LDDs of laser control 112 provide current to respective laser diodes 104a, 104b, 104c, 104d according to display data received from a display engine 114.

SLP 102 may include a beam combiner 116 to aggregate the beams outputted by laser diodes 104a, 104b, 104c, 104d into a single combined beam. In one example, beam combiner 116 includes optical elements 116a, 116b, 116c, 116d, each of which is positioned and oriented to receive an output beam from a respective one of laser diodes 104a, 104b, 104c, 104d. In one example, optical element 116a reflects at least a portion of the output beam from laser diode 104a towards optical element 116b. Optical element 116b combines at least a portion of the output beam from laser diode 104b with the beam received from optical element 116a to form a first combined beam that is directed towards optical element 116c. Optical element 116c combines at least a portion of the output beam from laser diode 104c with the first combined beam received from optical element 116b to create a second combined beam that is directed towards optical element 116d. Optical element 116d combines at least a portion of the output beam from laser diode 104d with the second combined beam to form a third combined beam 120 that is outputted from beam combiner 116. A first beam portion 120a of beam 120 may be directed towards optical scanner 108, and a second beam portion 120b of beam may be directed towards a photodetector 124 or other device, e.g., for laser output monitoring purposes.

In one example, optical scanner 108 includes two scan mirrors 108a, 108b. Scan mirrors 108a, 108b may be mono-axis mirrors, each of which oscillates or rotates about its respective axes. In another example, optical scanner 108 may be a 2D scan mirror that is rotatable about two different axes. The scan mirror(s) of optical scanner 108 may be microelectromechanical systems (MEMS) mirror(s), piezoelectric mirror(s), and the like. In other examples, optical scanner 108 may be a mirrorless optical scanner, e.g., a fiber optical scanner, or may use a combination of mirror and mirrorless optical scanning elements. Optical scanner 108 scans light over in-coupler 204 by sweeping the scan mirror(s) through a range of scan orientations. For each scan orientation, optical scanner 108 receives beam 120a from beam combiner 116 and reflects beam 120a towards in-coupler 204. In-coupler 204 may directly receive the reflected beam from optical scanner 108, or there may be relay optics between optical scanner 108 and in-coupler 204 to direct the reflected beam to in-coupler 204. A scan mirror control 128 is operable to apply driving voltages to the scan mirror(s) of optical scanner 108. Scan mirror control 128 generates sync controls for the scan mirror(s) according to display data received from display engine 114.

A safety microcontroller (MCU) 132 may be provided to monitor laser safety. In one implementation, safety MCU 132 communicates with a lens fault detection (LFD) circuit 136 that is electrically coupled to combiner lens 224 to sense when there is a fault in one or more layers of combiner lens 224, e.g., when there is a crack or break in lightguide 228. A fault in lightguide 208 may result in unsafe laser emission from combiner lens 224, e.g., unsafe for a Class 1 laser device. When such a fault occurs, it may be desirable to turn off the laser power supply as soon as possible. Safety MCU 132 communicates with laser control 112, display engine 114, and a host processor (or application processor) 140. When safety MCU 132 detects an output signal from LFD circuit 136 that is indicative of a lens fault condition, safety MCU 132 may disable laser control 112 and send notifications to display engine 114 and host processor 140. Safety MCU 132 may respond to other laser safety events that are not specifically described herein, e.g., those based on the output of photodetector 124.

Figure 2:
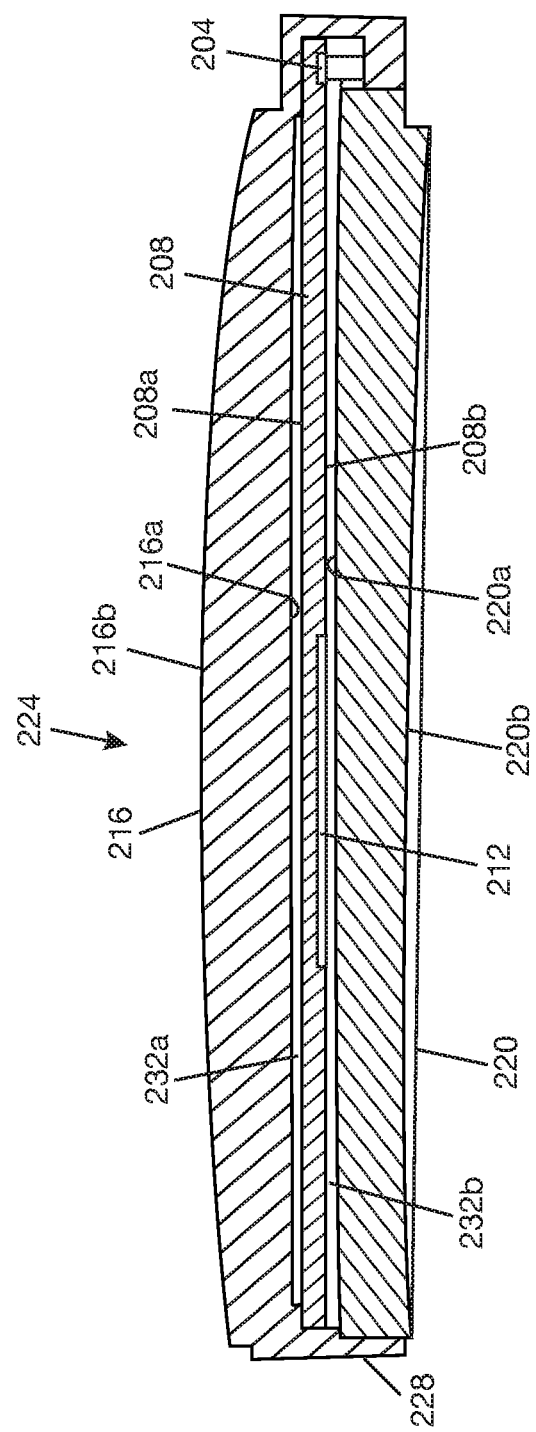
FIG. 2 is a cross-sectional view of an example combiner lens.

As shown more clearly in FIG. 2, according to one implementation, combiner lens 224 includes world side (WS) lens 216, lightguide 208, and eye side (ES) lens 220 arranged in a stack. The terms "world side" and "eye side" are relative to use of combiner lens 224 as an eyeglass. In one example, WS lens 216 may have a flange 228 for attachment of lightguide 208 and ES lens 220 in a stacked arrangement. Alternatively, WS lens 216 and ES lens 220 may be provided by a single lens body that is molded around lightguide 208, i.e., WS lens 216 and ES lens 220 may be integrally formed. Alternatively, WS lens 216 and lightguide 208 may be attached to each other by a first seal located near a periphery of lightguide 208, and lightguide 208 and ES lens 220 may be attached to each other by a second seal located near a periphery of lightguide 208. Other methods of securing the stack of combiner lens 224 besides those just described may be used.

WS lens 216 has an inner lens surface 216a and an outer lens surface 216b. In some examples, WS lens 216 may be a meniscus lens, i.e., both lens surfaces 216a, 216b are convex. Alternatively, WS lens 216 may be a planoconvex lens, e.g., inner lens surface 216a is planar and outer lens surface 216b is convex. Likewise, ES lens 220 has an inner lens surface 220a and an outer lens surface 220b. In some examples, ES lens 220 may be a biconcave lens, i.e., both lens surfaces 220a, 220b are concave. Alternatively, ES lens 220a may be a planoconcave lens, e.g., inner lens surface 220a is planar and outer lens surface 220b is concave. Curvatures of the lens surfaces of WS lens 216 and ES lens 220 may be selected to achieve a desired eyeglasses prescription. In cases where WS lens 216 and ES lens 220 are formed by molding a lens body around lightguide 208, inner lens surfaces 216a, 220a of WS lens 216 and ES lens 220 may be dictated by the shape of lightguide 208. WS lens 216 and ES lens 220 may be made of suitable lens material, such as plastic, e.g., polycarbonate, or glass. Preferably, the materials of WS lens 216 and ES lens 220 are transparent to at least some electromagnetic wavelengths, e.g., wavelengths in the visible range or wavelengths of light to be projected onto combiner lens 224.

Lightguide 208 is an optical substrate that is capable of transferring light by TIR. Lightguide 208 may be made of plastic or glass or other material capable of transferring light. Preferably, the material of lightguide 208 is transparent to at least the some electromagnetic wavelengths, e.g., wavelengths in the visible range or wavelengths of light to be projected onto combiner lens 224. Lightguide 208 has major lightguide surfaces 208a, 208b, which are disposed on opposite sides of lightguide 208 and separated by a substrate thickness of lightguide 208. Lightguide surface 208a is in opposing relation to inner lens surface 216a of WS lens 216, and lightguide surface 208b is in opposing relation to inner lens surface 220a of ES lens 220. Lightguide 208 may be a planar waveguide, i.e., both lightguide surfaces 208a, 208b lie in a flat plane. Alternatively, lightguide 208 may be a curved lightguide, e.g., at least one of lightguide surfaces 208a, 208b, or a portion thereof, is curved, i.e., does not lie in a flat plane.

In-coupler 204 and out-coupler 212 are attached to lightguide 208, integrally formed with lightguide 208, embedded in lightguide surfaces 208a, 208b, or otherwise physically coupled to lightguide 208. In the illustrated example, in-coupler 204 and out-coupler 212 are shown as carried on or proximate lightguide surface 208b. This generally means that in-coupler 204 and out-coupler 212 are configured as transmission couplers. Alternatively, either or both of in-coupler 204 and out-coupler 212 may be carried on or proximate lightguide surface 208a, with in-coupler 204 and out-coupler 212 being transmission or reflection couplers as appropriate. In one example, in-coupler 204 and out-coupler 212 may be surface relief gratings or volume hologram gratings or metasurfaces. In another example, in-coupler 204 may be a prism. In yet another example, in-coupler 204 may be omitted, and light may be coupled into lightguide 208 directly through a surface of lightguide 208. Lightguide 208 may carry other light directing elements not shown, e.g., exit pupil expanders.

In one implementation, a gap 232a is formed between inner lens surface 216a of WS lens 216 and lightguide surface 208a by the relative shapes of these surfaces and/or by spacing these surfaces apart. Also, a gap 232b is formed between inner lens surface 220a of ES lens 220 and lightguide surface 208b by the relative shapes of these surfaces and/or by spacing these surfaces apart. Each of gaps 232a, 232b may have a height in a range from 2 microns to 100 microns in some examples. Gaps 232a, 232b may be uniform or non-uniform in height depending on the shapes of the surfaces that define the gaps. Gaps 232a, 232b contain a medium, which is typically, but not limited to, air. In general, the medium in each of gaps 232a, 232b has a refractive index that is lower than a refractive index of lightguide 208 so as to enable light to propagate along lightguide 208 by TIR. Preferably, gaps 232a, 232b are hermetically sealed to prevent moisture and/or dust from entering the gaps. This generally involves forming appropriate seals at lens-to-lens and lens-to-lightguide interfaces in the stack of combiner lens 224.

To detect lens fault caused by a crack or break in the layer(s) of combiner lens 224, the layer(s) carry one or more conductive traces. Combiner lens 224 has three layers—lightguide 208, WS lens 216, and ES lens 220—each of which may carry one or more conductive traces.

Figure 3:
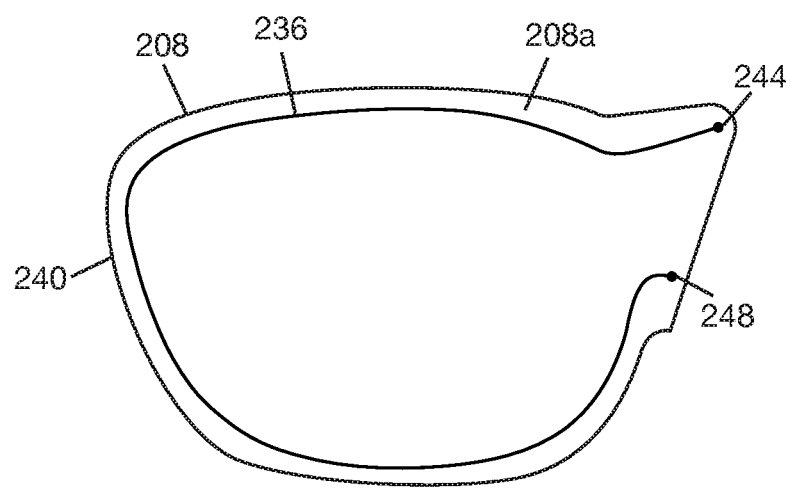
FIG. 3 is a top view of the lightguide of FIG. 2 with a conductive trace formed on a major surface of the lightguide.
Figure 4:
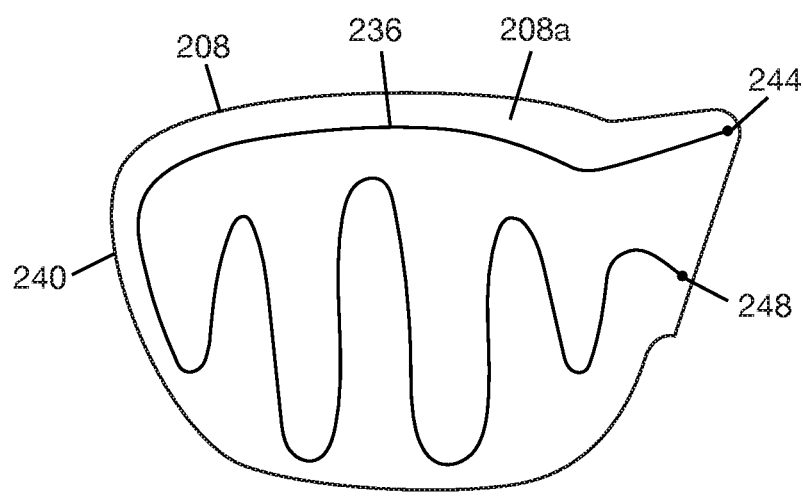
FIG. 4 is a top view of the lightguide of FIG. 2 showing a different pattern of the conductive trace of FIG. 3 on the major surface of the lightguide.
Figure 5:
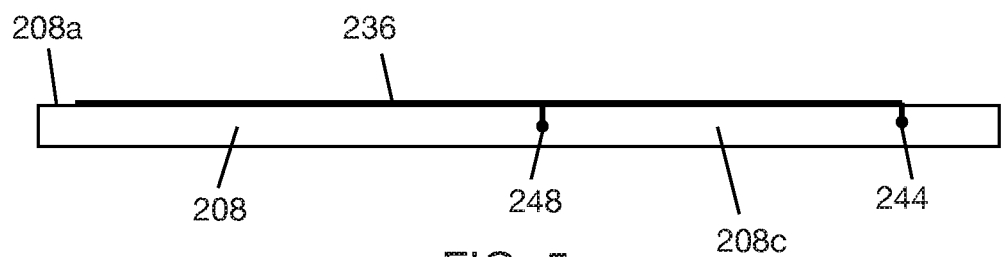
FIG. 5 is a side view of the lightguide of FIG. 2 with a conductive trace formed on a major surface of the lightguide and extending to a side of the lightguide.

For illustrative purposes, FIG. 3 shows an electrically conductive trace 236 formed, e.g., deposited or printed, on lightguide surface 208. Conductive trace 236 is a continuous line of electrically conductive material that ends in terminals 244, 248. The electrically conductive material of conductive trace 236 may be a transparent electrically conductive material, such as indium tin oxide (ITO). In cases where the electrically conductive material of conductive trace 236 is not transparent, conductive trace 236 may be a fine trace i.e., a trace small enough in line width to be substantially invisible to the naked eye. Alternatively, conductive trace 236 may be a fine trace made of a transparent electrically conductive material. Different patterns of conductive trace 236 can be used to achieve different coverages of conductive material on the lightguide surface. Non-limiting examples of patterns of conductive trace 236 are shown in FIGS. 3 and 4. In general, the more points of contact the conductive trace 236 has with the underlying lightguide surface 208a, the more effective conductive trace 236 will be in responding to faults in lightguide surface 208a. Terminals 244, 248 of conductive trace 236 may be located on lightguide surface 208a, as shown in FIGS. 3 and 4. Alternatively, as shown in FIG. 5, terminals 244, 248 may be located on a side surface 208c of lightguide 208, i.e., conductive trace 236 may extend to the side surface 208c of lightguide 208.

In one implementation, LFD circuit 136 (in FIG. 1) is an open circuit detector (OCD) circuit that may be electrically connected to conductive trace 236 to form an electrical circuit that is normally closed. The OCD circuit monitors the normally closed circuit for an open. If there is a break in conductive trace 236 due to a fault in the underlying lightguide surface 208a, the normally closed circuit will be open. The OCD circuit generates a signal that is representative of a state of the electrical circuit, i.e., an open state or a closed state. Examples of OCD circuits are described herein for a single conductive trace located on one combiner lens surface and for multiple conductive traces located on one or more combiner lens surfaces. However, the example OCD circuits described herein are not intended to be limiting, and any circuit capable of detecting an open circuit may be electrically coupled to conductive trace(s) to detect when there is a break in the conductive trace(s) that may be indicative of a lens fault.

Figure 6:
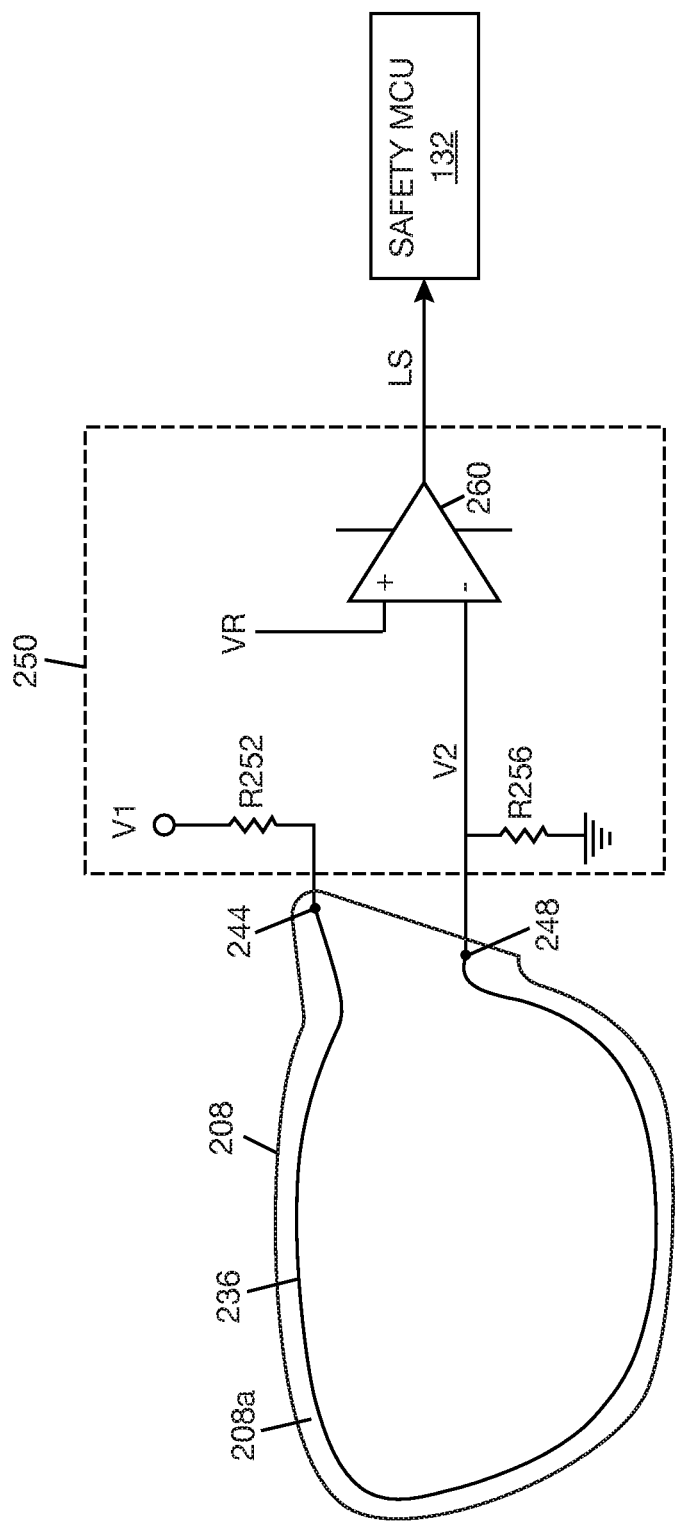
FIG. 6 shows an open circuit detector (OCD) circuit connected to a conductive trace formed on a major surface of a lightguide.

FIG. 6 shows an example OCD circuit 250 (which may be used as LFD circuit 136 in FIG. 1) to monitor discontinuities (or breaks) in a single conductive trace, e.g., conductive trace 236. In the illustrated example of FIG. 6, OCD circuit 250 includes a voltage divider circuit formed by connecting terminal 244 to a voltage source V1 through a resistor R252 and by connecting terminal 248 to ground through a resistor R256. In one example R252 is a strong pull-up resistor, i.e., a resistor having a relatively low resistance, and R256 is a weak pull-down resistor, i.e., a resistor having a relatively high resistance. The voltage V2 out of the divider circuit is fed to a negative input of a comparator 260, and a positive input of comparator 260 is connected to a reference voltage VR. An output signal LS of comparator 260 is fed to a lens input of safety MCU 132.

In use, the voltage on the negative input of comparator 260 will be set to a higher voltage than VR via the voltage divider circuit. Under normal condition, LS will be normally LOW since the open gain of comparator 260 would have a higher voltage on the negative input than the positive input. If a break occurs in conductive trace 236 due to a fault in the underlying surface, e.g., lightguide surface 208a, an open will be created in the circuit that will cause the negative input of comparator 260 to go active LOW via the weak pull-down resistor R256. This LOW on the negative input of comparator 260 will now cause LS to go HIGH, i.e., since VR at the positive input of comparator 260 has become higher than the voltage at the negative input of comparator 260. The HIGH level event will be detected at safety MCU 132 as a lens fault condition.

Figure 7:
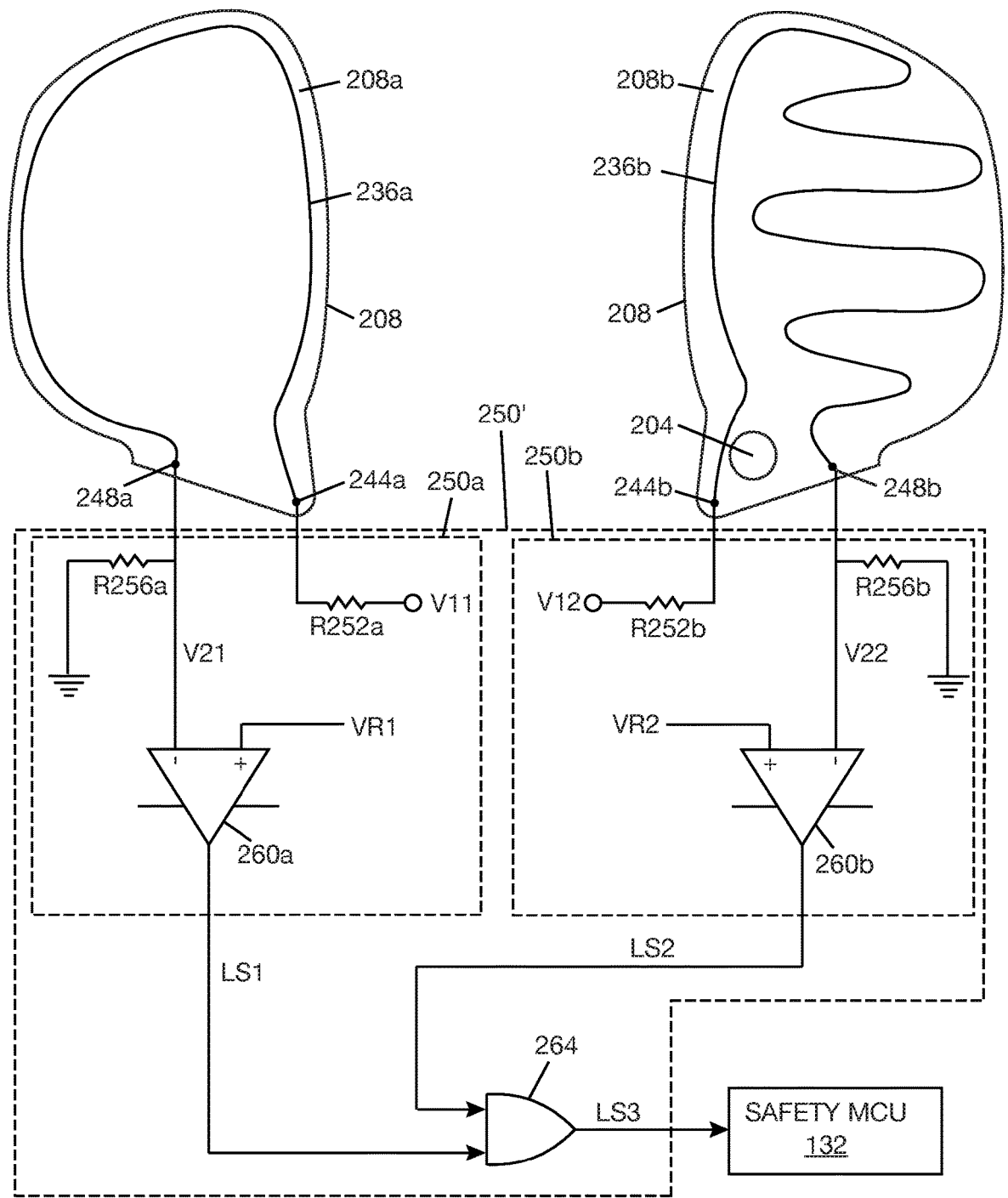
FIG. 7 shows an OCD circuit connected to two conductive traces formed on two separate major surfaces of a lightguide.

FIG. 7 shows an example OCD circuit 250' (which may be used as LFD circuit 136 in FIG. 1) to monitor discontinuities (or breaks) in two conductive traces, e.g., conductive trace 236a, 236b. For illustrative purposes, conductive trace 236a may be carried by lightguide surface 208a, and conductive trace 236 may be carried by lightguide surface 208b. The patterns formed by conductive traces 236a, 236b are different in FIG. 7, but the patterns could be the same in other implementations. OCD circuit 250' includes an OCD sub-circuit 250a that is connected to conductive trace 236a and an OCD sub-circuit 250b that is connected to conductive trace 236b. Each of OCD sub-circuits 250a, 250b may have the same structure shown for OCD circuit 250 in FIG. 6. That is, OCD sub-circuit 250a includes a voltage divider circuit formed by connecting terminal 244a to voltage source V11 through resistor R252a and by connecting terminal 248a to ground through resistor R256a. A negative input of a comparator 260a is connected to an output voltage V21 of the voltage divider circuit, and a positive input of comparator 260a is connected to a reference voltage VR1. Similarly, OCD sub-circuit 250b includes a voltage divider circuit formed by connecting terminal 244b to voltage source V12 through resistor R252b and by connecting terminal 248b to ground through resistor R256b. A negative input of a comparator 260b is connected to an output voltage V22 of the voltage divider circuit, and a positive input of comparator 260b is connected to reference voltage VR2. Each of OCD sub-circuits 250a, 250b works similarly to OCD circuit 250 described in FIG. 6. The output signal LS1 of comparator 260a and the output signal LS2 of comparator 260b are fed to an OR gate 264, and the output signal LS3 of OR gate 264 is fed to the lens input of safety MCU 132. Under normal condition, LS1 and LS2 will be normally LOW. LS1 will go HIGH when there is a break in conductive trace 236a. Similarly, LS2 will go HIGH when there is a break in conductive trace 236b. Either or both of LS1 and LS2 going HIGH will cause LS3 to go HIGH, which would trigger a lens fault condition at safety MCU 132.

Figure 8:
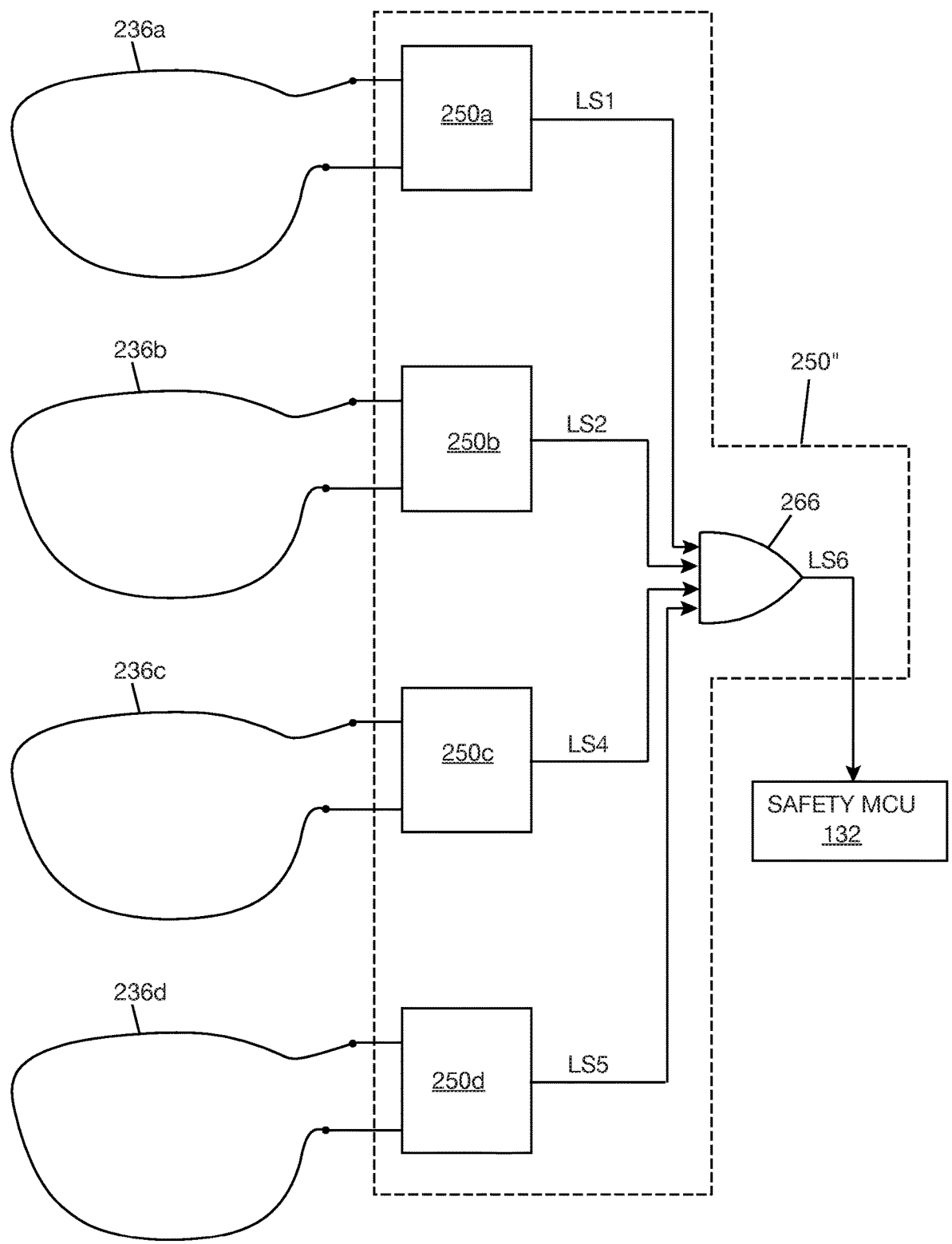
FIG. 8 shows an OCD circuit connected to four conductive traces according to one example.

FIG. 8 shows an example OCD circuit 250" (which may be used as LFD circuit 136 in FIG. 1) to monitor discontinuities (or breaks) in four conductive traces, e.g., conductive traces 236a, 236b, 236c, 236d. Although OCD circuit 250" is demonstrated for four conductive traces, it is not limited to four conductive traces and could be adapted to work with more or less than four conductive traces. In one illustrative example, conductive traces may be carried by surfaces 208a, 208b, 216a, 220a (in FIG. 2), respectively. The patterns formed by conductive traces 236a, 236b, 236c, 236d are the same in FIG. 8, but the patterns could be different in other implementations. OCD circuit 250" includes OCD sub-circuit 250a that is connected to conductive trace 236a, OCD sub-circuit 250b that is connected to conductive trace 236b, OCD sub-circuit 250c that is connected to conductive trace 236c, and OCD sub-circuit 250d that is connected to conductive trace 236d. Each of OCD sub-circuits 250a, 250b, 250c, 250d may have a structure as shown for OCD circuit 250 in FIG. 6 or other structure capable of responding to an open created by a break in respective conductive traces 236a, 236b, 236c, 236d. The output signals LS1, LS2, LS3, LS4 of OCD sub-circuits 250a, 250b, 250c, 250d, respectively, are fed to an OR gate 266. The output signal LS6 of OR gate 266 is fed to the lens input of safety MCU 132. Under normal condition, each of LS1, LS2, LS4, LS5 will be normally LOW. Each of LS1, LS2, LS3, LS4 will go HIGH when there is a break in the respective conductive trace 236a, 236b, 236c, 236d. Any of LS1, LS2, LS4, LS5 going HIGH or all of LS1, LS2, LS4, LS5 going HIGH will cause LS6 to go HIGH, which would trigger a lens fault condition at safety MCU 132.

Figure 9:
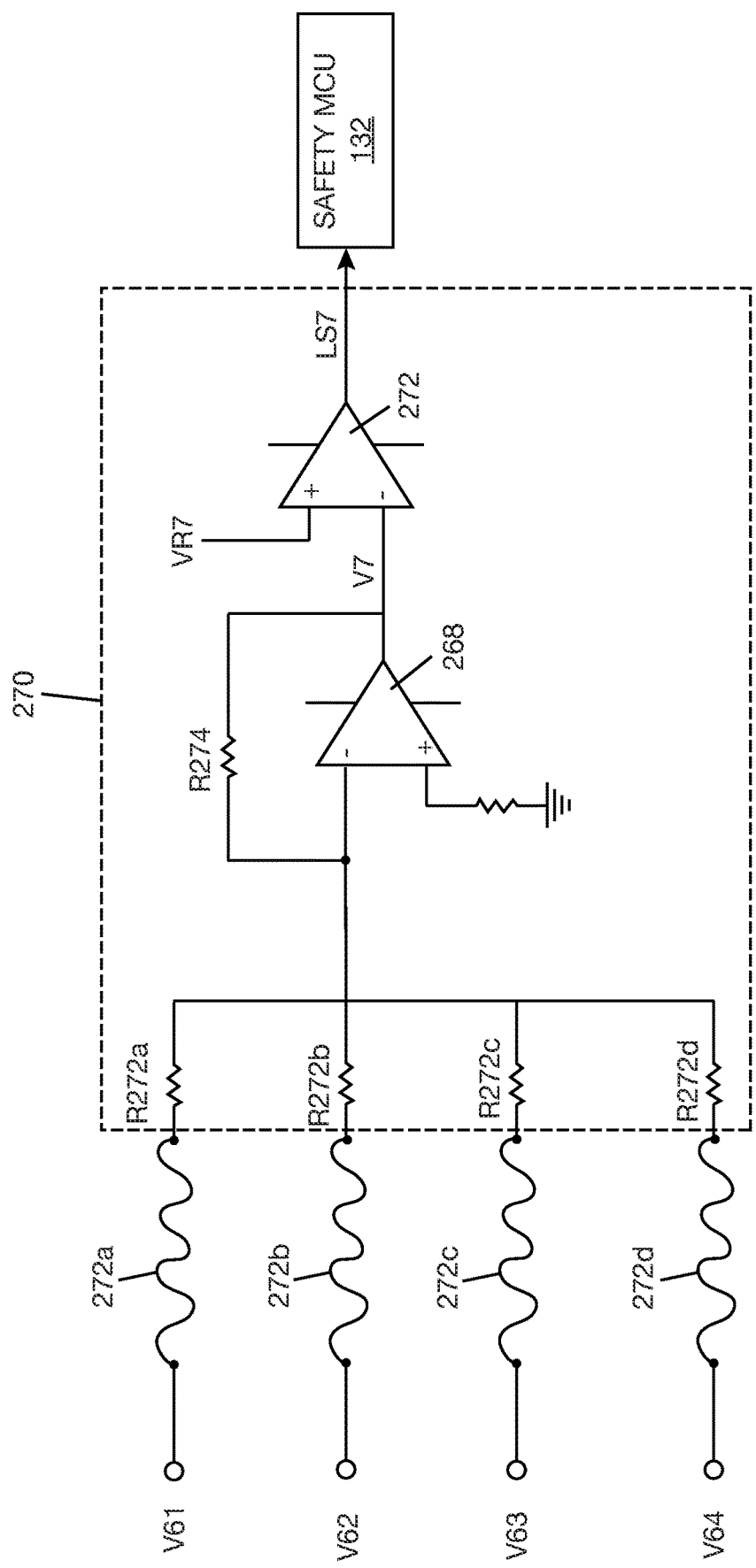
FIG. 9 shows an OCD circuit connected to four conductive traces according to another example.

FIG. 9 shows an example OCD circuit 270 (which may be used as LFD circuit 136 in FIG. 1) to monitor breaks (or discontinuities) in four conductive traces, e.g., conductive traces 236a, 236b, 236c, 236d. As an example, conductive traces may be carried by surfaces 208a, 208b, 216a, 220a (in FIG. 2), respectively. Conductive traces 236a, 236b, 236c, 236d could have any desired shape effective in detecting a fault in a surface. Also, there may be more or less than four conductive traces, depending on the number of combiner lens surfaces to be monitored for a fault. Input terminals of conductive traces 236a, 236b, 236c, 236d are connected to voltage sources V61, V62, V63, and V64. Output terminals of conductive traces 236a, 236b, 236c, 236d are connected to a negative input of a summing amplifier 268 through resistors R272a, R272b, R272c, R272d. A feedback resistor R274 is connected between the output of summing amplifier 268 and the negative input of summing amplifier 268. The output voltage V7 of summing amplifier 268 will be proportional to the sum of V61, V62, V63, and V64. V7 is fed to a negative input of a comparator 272, while a positive input of comparator 272 is tied to a reference voltage VR7. The output signal LS7 of comparator 272 is fed to the lens input of safety MCU 132. In use, VR7 is set to a level just below the summed value of voltages fed to the negative input of summing amplifier 268. If a break occurs in any of conductive traces 236a, 236b, 236c, 236d, V7 will drop below VR7, which would cause comparator 272 to trip and invoke a lens fault condition at safety MCU 132.

Returning to FIG. 2, faults in combiner lens 224 may be caused also by opposing surfaces within combiner lens 224 being crushed together or deforming to touch one another. To detect these kinds of faults, a matrix of conductive traces may be used. Given two surfaces within combiner lens 224 that are spaced apart by a gap containing an electrically non-conductive material or by an electrically non-conductive material, the rows of the matrix can be formed on one of the two surfaces, and the column of the matrix can be formed on the other of the two surfaces. In combiner lens 224, the two surfaces may be inner lens surface 216a and top lightguide surface 208a or top lightguide surface 208a and bottom lightguide surface 208b or bottom lightguide surface 208a and inner lens surface 220a. Under normal conditions, the rows of the matrix are electrically insulated from the column of matrix. However, if one or both of the surfaces deform such that the row pattern makes contact with the column pattern, a short circuit will occur. The short circuit can be detected, and a corresponding lens fault signal can be generated. It is possible to pinpoint where the short has occurred by scanning the matrix. Circuits that scan a matrix are known, e.g., in the art of scanning a key in a matrix keypad, and such circuits can be used herein to scan the matrix of conductive traces.

Figure 10:
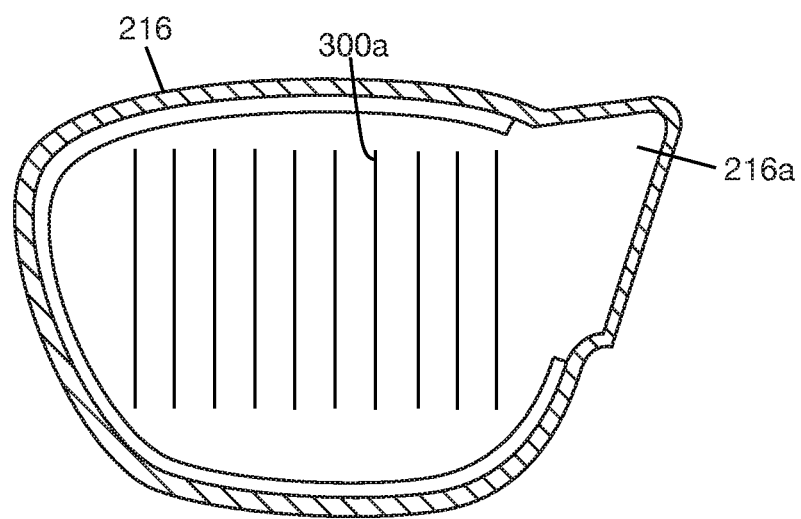
FIG. 10 shows columns of conductive traces formed on an inner lens surface.
Figure 11:
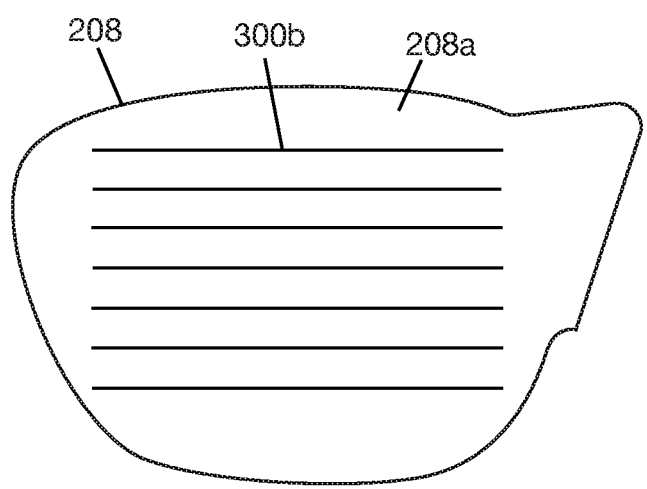
FIG. 11 shows rows of conductive traces formed on a major surface of a lightguide.
Figure 12:
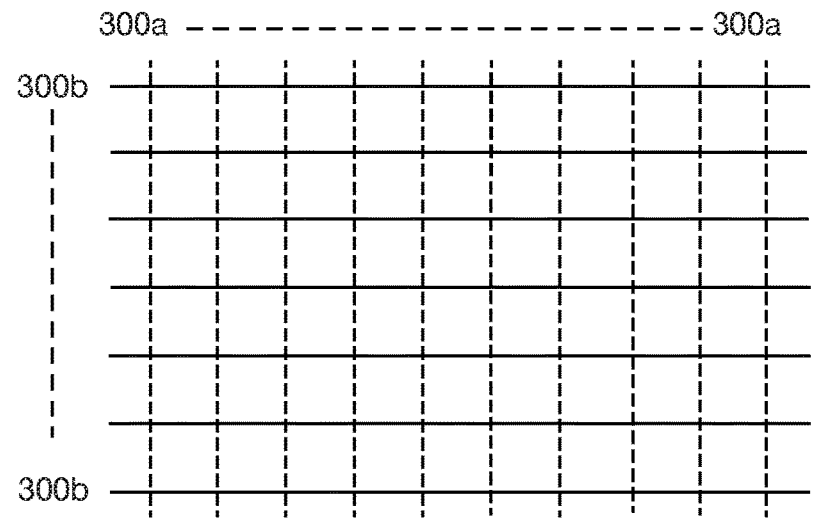
FIG. 12 shows a matrix formed by the columns of conductive traces of FIG. 10 and the rows of conductive traces of FIG. 11.

For illustrative purposes, FIG. 10 shows columns of conductive traces 300a formed on inner lens surface 216a of WS lens 216, and FIG. 11 shows rows of conductive traces 300b formed on lightguide surface 208a of lightguide 208 (this could be reversed, i.e., the columns could be on lightguide surface 208a, and the rows could be on inner lens surface 216a). The two surfaces 216a, 208a are selected for illustrative purposes only, i.e., the rows and columns of conductive traces could be formed on lightguide surfaces 208a, 208b (in FIG. 2) instead or on lightguide and lens surfaces 208b, 220a (in FIG. 2) instead. The rows and columns of conductive traces 300a, 300b define a matrix, as illustrated in FIG. 12. In FIG. 2, lightguide surface 208a is in opposing relation to inner lens surface 216a. A lens fault condition in combiner lens 224 can be detected if any of lightguide surface 208a and inner lens surface 216a deforms or collapses such that the conductive traces 300a, 300b short together. The OCD circuit for this example could be a circuit that scans the matrix in FIG. 12 to detect if and where a short has occurred.

Figure 13:
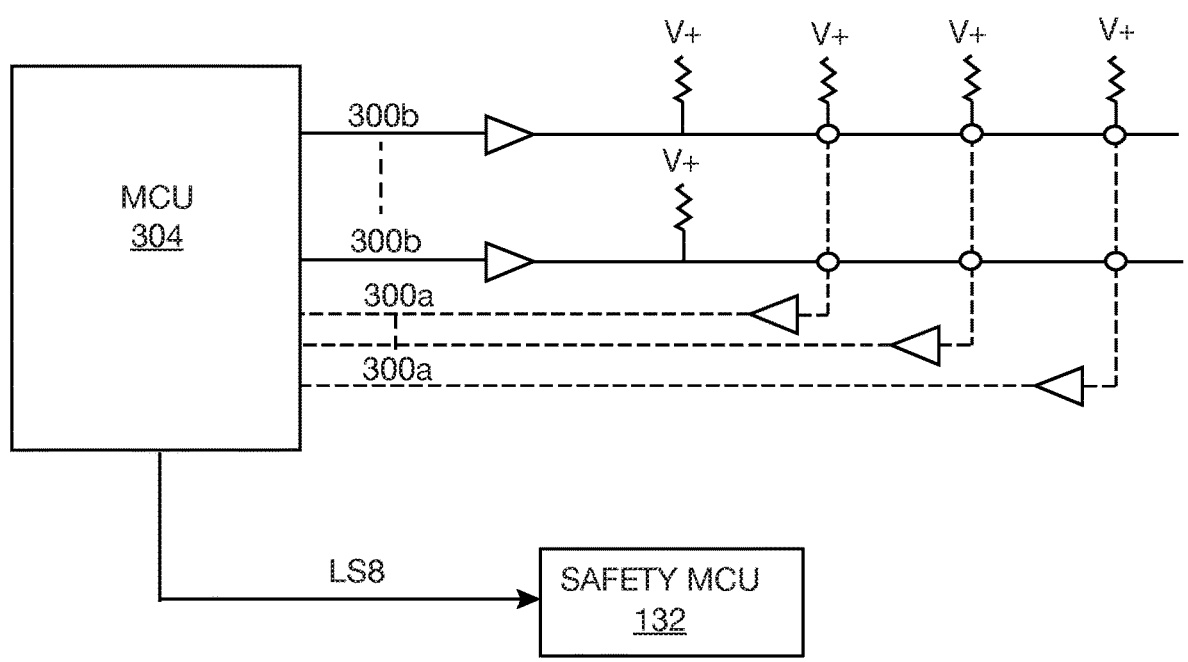
FIG. 13 shows scanning of the matrix of FIG. 12 to detect a short circuit condition.

For illustrative purposes, FIG. 13 shows a microcontroller (MCU) 304 that is programmed to scan the matrix of conductive traces 300a, 300b. (MCU 304 corresponds to LFD circuit 136 in FIG. 1.) The rows of conductive traces 300b are connected to open drain output ports of MCU 304. The columns of conductive traces 300a are connected to input ports of MCU 304. MCU 304 drives the rows 300b LOW, one at a time. For each row 300b that is driven LOW, the respective columns 300a are read. If a short exists, a column will read back a LOW instead of a HIGH condition. If a short condition is detected, MCU 304 sends a signal LS8 to the lens input of safety MCU 132 that indicates a lens fault condition. Signal LS8 may include an indication of the location of the lens fault, which is related to the row and column combination where the short condition is detected.

Figure 14:
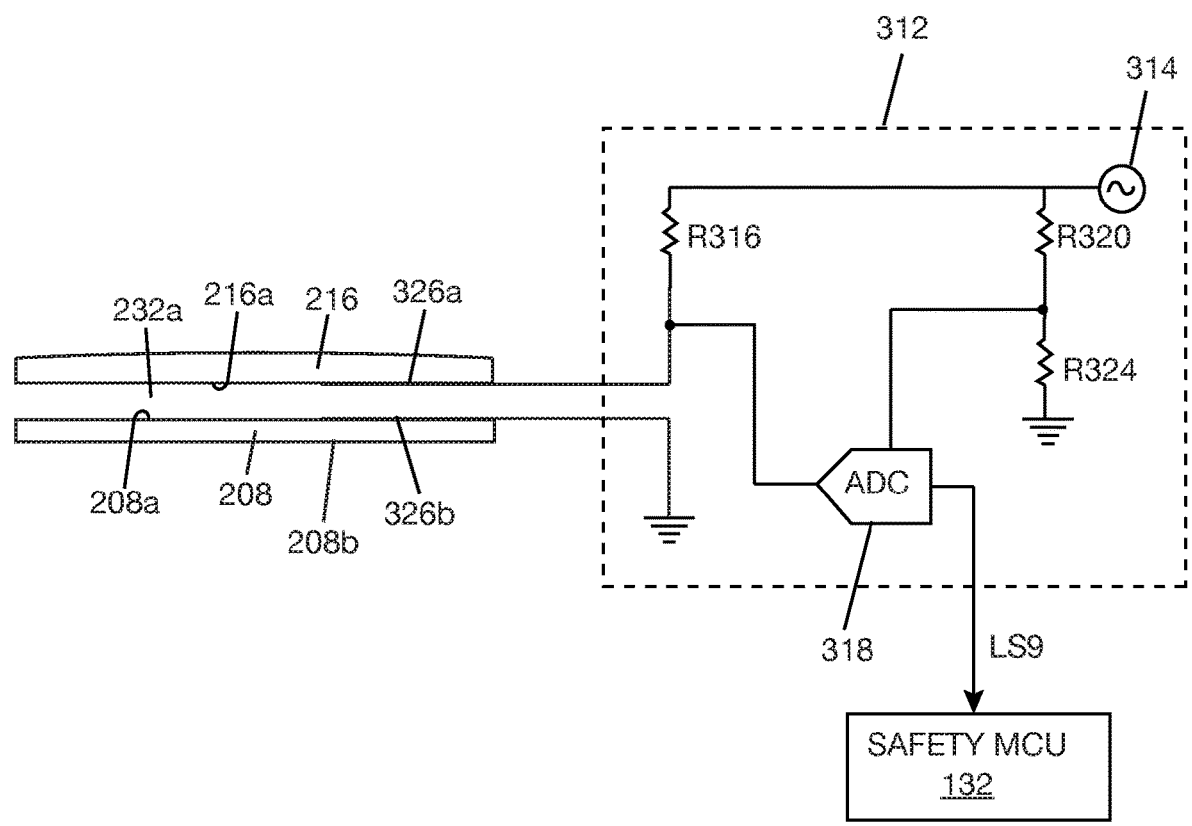
FIG. 14 shows layers of a combiner lens treated as capacitive plates and a capacitive sensing circuit to detect dielectric changes in a gap between the capacitive plates.

In another implementation, the layers of combiner lens 224 (in FIG. 2), i.e., WS lens 216 (in FIG. 2), lightguide 208 (in FIG. 2), and ES lens 220 (in FIG. 2), which are separated by gaps, may be treated as capacitive plates. A capacitive sensing circuit could detect if a dielectric change occurs in the gap that indicates a lens fault condition. For example, one layer deforming towards another or being crushed against another would result in a dielectric change in the gap that would be indicative of a lens fault condition. For illustrative purposes, FIG. 14 shows WS lens 216 and lightguide 208, having respective surfaces 216a, 208a separated by gap 236a, as capacitive plates. A capacitive sensing circuit 312 is connected to conductive traces 326a, 326b formed on WS lens 126 and lightguide 208. In a non-limiting example, capacitive sensing circuit 312 may include an excitation source 314 that is connected to conductive trace 326a on WS lens 216 through a resistor R316. Conductive trace 326b on lightguide 208 may be connected to ground. In a non-limiting example, capacitive sensing circuit 312 may include an analog to digital converter (ADC) 318 having an input node connected to conductor trace 326a on WS lens 216 and a reference node connected to an output of a voltage divider circuit defined by resistors R320, R324. An output signal LS9 of ADC may be connected to lens input of safety MCU 132. Conductive traces 326a, 326b could be replaced with conductive dots in this example since a large coverage of surfaces 216a, 208a is not required to detect lens fault.

Combinations of the arrangements of conductive traces and OCD/LFD circuits described above can be used in a combiner lens to detect fault in any layer (lightguide, WS lens, and ES lens) of the combiner lens and/or to detect fault that occurs because of layers being crushed together or because of one layer deforming towards another layer.

The above description of illustrated embodiments, including what is described in the Abstract of the disclosure, is not intended to be exhaustive or to limit the embodiments to the precise forms disclosed. Although specific implementations and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

The invention claimed is:

1. A combiner lens, comprising:
   a lens;
   a lightguide in stack with the lens; and
   at least a first electrically conductive trace formed on or carried by the lightguide, the at least a first electrically conductive trace having a first input terminal and a first output terminal for electrical connections.

2. The combiner lens of claim 1, wherein the lightguide has a first lightguide surface and a second lightguide surface that is spaced apart from the first lightguide surface by a substrate thickness of the lightguide, and wherein the at least a first electrically conductive trace is formed on and external to, at least in part, the first lightguide surface.

3. The combiner lens of claim 2, further comprising at least a second electrically conductive trace formed at least in part on the second lightguide surface, the at least a second electrically conductive trace having a second input terminal and a second output terminal for electrical connections.

4. The combiner lens of claim 1, further comprising at least a second electrically conductive trace formed on or carried by the lens, the at least a second electrically conductive trace having a second input terminal and a second output terminal for electrical connections.

5. The combiner lens of claim 1, wherein the lens is a first lens, and further comprising a second lens in stack with the lightguide and the first lens, wherein the lightguide is positioned between the first lens and the second lens.

6. The combiner lens of claim 5, further comprising at least a second electrically conductive trace formed on or carried by at least one of the first lens and the second lens.

7. The combiner lens of claim 5, wherein an inner surface of the first lens is separated from the lightguide by a first gap, and wherein an inner surface of the second lens is separated from the lightguide by a second gap.

8. The combiner lens of claim 1, wherein the lightguide is separate from and external to the lens.

9. A combiner lens system, comprising:
a lens;
a lightguide in stack with the lens, the lightguide having a first lightguide surface and a second lightguide surface that is spaced apart from the first lightguide surface by a substrate thickness of the lightguide;
at least a first electrically conductive trace formed at least in part on the first lightguide surface, the at least a first electrically conductive trace having a first input terminal and a first output terminal for electrical connections; and
an open circuit detector electrically coupled to the first input terminal and the first output terminal to form an electrical circuit that is normally closed, the open circuit detector to monitor the electrical circuit for an open circuit and generate an output signal that is indicative of an electrical state of the electrical circuit.

10. The combiner lens system of claim 9, further comprising at least a second electrically conductive trace formed on at least one of the second lightguide surface and a surface of the lens, the at least a second electrically conductive trace having a second input terminal and a second output terminal for electrical connections.

11. The combiner lens system of claim 10, wherein the open circuit detector comprises a summing circuit having an input electrically coupled to the first output terminal of the at least a second electrically conductive trace and the second output terminal of the at least a second electrically conductive trace, the summing circuit to generate a summing signal that is proportional to a sum of voltages at the first output terminal of the at least a first electrically conductive trace and the second output terminal of the at least a second electrically conductive trace.

12. The combiner lens system of claim 11, wherein the open circuit detector further comprises a comparator that receives the summing signal as a first input and a reference voltage as a second input, the comparator to generate a comparator signal that is representative of a comparison between the summing signal and the reference voltage, the comparator signal having a first value when the electrical circuit is a closed circuit and a second value when the electrical circuit is an open circuit.

13. The combiner lens system of claim 9, wherein the open circuit detector comprises a voltage divider circuit electrically coupled to the first input terminal and the first output terminal of the at least a first electrically conductive trace.

14. The combiner lens system of claim 13, wherein the open circuit detector further comprises a comparator that receives an output of the voltage divider circuit as a first input and a reference voltage as a second input, the comparator to generate a comparator signal that is representative of a comparison between the output of the voltage divider circuit and the reference voltage, the comparator signal having a first value when the electrical circuit is a closed circuit and a second value when the electrical circuit is an open circuit.

15. The combiner lens system of claim 9, wherein the lens is a first lens, and further comprising a second lens in stack with the lightguide and the first lens, wherein the lightguide is positioned between the first lens and the second lens.

16. The combiner lens system of claim 15, further comprising at least a second electrically conductive trace formed on at least one of the second lightguide surface, a surface of the first lens, and a surface of the second lens, the at least a second electrically conductive trace having a second input terminal and a second output terminal for electrical connections, wherein the open circuit detector is electrically coupled to the first input terminal and the first output terminal of the at least a first electrically conductive trace and the second input terminal and the second output terminal of the at least a second electrically conductive trace to form a respective electrical circuit that is normally closed, the open circuit detector to monitor each respective circuit for an open circuit and generate an output signal that is indicative of an electrical state of the respective electrical circuits.

* * * * *

UNITED STATES PATENT AND TRADEMARK OFFICE
CERTIFICATE OF CORRECTION

PATENT NO. : 11,662,579 B2
APPLICATION NO. : 16/898773
DATED : May 30, 2023
INVENTOR(S) : Shreyas Potnis et al.

Page 1 of 1

It is certified that error appears in the above-identified patent and that said Letters Patent is hereby corrected as shown below:

In the Claims

At Column 14 Line 02, please replace "second" before "electrically" with "first"

Signed and Sealed this
Fifth Day of December, 2023

Katherine Kelly Vidal
*Director of the United States Patent and Trademark Office*